United States Patent [19]

Atsumi et al.

[11] Patent Number: 4,916,665
[45] Date of Patent: Apr. 10, 1990

[54] SEMICONDUCTOR MEMORY DEVICE WITH P-CHANNEL MOS TRANSISTOR LOAD CIRCUIT

[75] Inventors: Shigeru Atsumi; Sumio Tanaka, both of Tokyo, Japan

[73] Assignee: Kabushiki Kaisha Toshiba, Kawasaki, Japan

[21] Appl. No.: 610,704

[22] Filed: May 16, 1984

[30] Foreign Application Priority Data

May 26, 1983 [JP] Japan .................................. 58-92641

[51] Int. Cl.$^4$ ............................................. G11C 11/40
[52] U.S. Cl. .............................. 365/185; 365/189.09;
365/181; 365/208; 365/210; 307/530
[58] Field of Search ............... 365/205, 207, 208, 189,
365/210, 190, 184, 185, 154; 307/530

[56] References Cited

U.S. PATENT DOCUMENTS

| | | | |
|---|---|---|---|
| 4,103,345 | 7/1978 | Suzuki et al. ........................ | 365/190 |
| 4,217,535 | 8/1980 | Suzuki et al. ........................ | 307/304 |
| 4,223,394 | 9/1980 | Pathak et al. ........................ | 365/210 |
| 4,504,748 | 3/1985 | Oritani ................................. | 365/205 |

FOREIGN PATENT DOCUMENTS 58-19791  2/1983  Japan .

OTHER PUBLICATIONS

Richman, "Characteristics and Operation of MOS Field Effect Devices", 1967, pp. 121-126.
M. Isobe et al., "An 18 ns CMOS/SOS 4K Static RAM", IEEE Journal of Solid-State Circuits, vol. SC-16, no. 5 (Oct. 1981), pp. 460-464.
Tietze, Schenk, "Korrigierter Nachdruck der dritten Auflage", Halbleiter-Schaltungstechnik, pp. 503-506 (1976).

Primary Examiner—Glenn A. Gossage
Attorney, Agent, or Firm—Finnegan, Henderson, Farabow, Garrett & Dunner

[57] ABSTRACT

A semiconductor memory device of the invention has a plurality of floating gate memory cells. A detector detects the data stored in a floating gate memory cell selected by a decoder and produces a corresponding detection signal. A load circuit amplifies the detection signal. The amplified detection signal is supplied to a differential amplifier. The differential amplifier compares the voltage of the amplified detection signal with a reference voltage from a reference voltage generator and produces a binary signal corresponding to the storage contents in the floating gate memory. The load circuit is a p-channel enhancement-type MOS transistor. The load transistor has a gate and drain which are connected to the node between the detector and the differential amplifier, and also has a source and substrate which receive a predetermined voltage.

4 Claims, 6 Drawing Sheets

SEMICONDUCTOR MEMORY DEVICE WITH P-CHANNEL MOS TRANSISTOR LOAD CIRCUIT

BACKGROUND OF THE INVENTION

The present invention relates to a semiconductor memory device with an improved load circuit.

Figure 1:
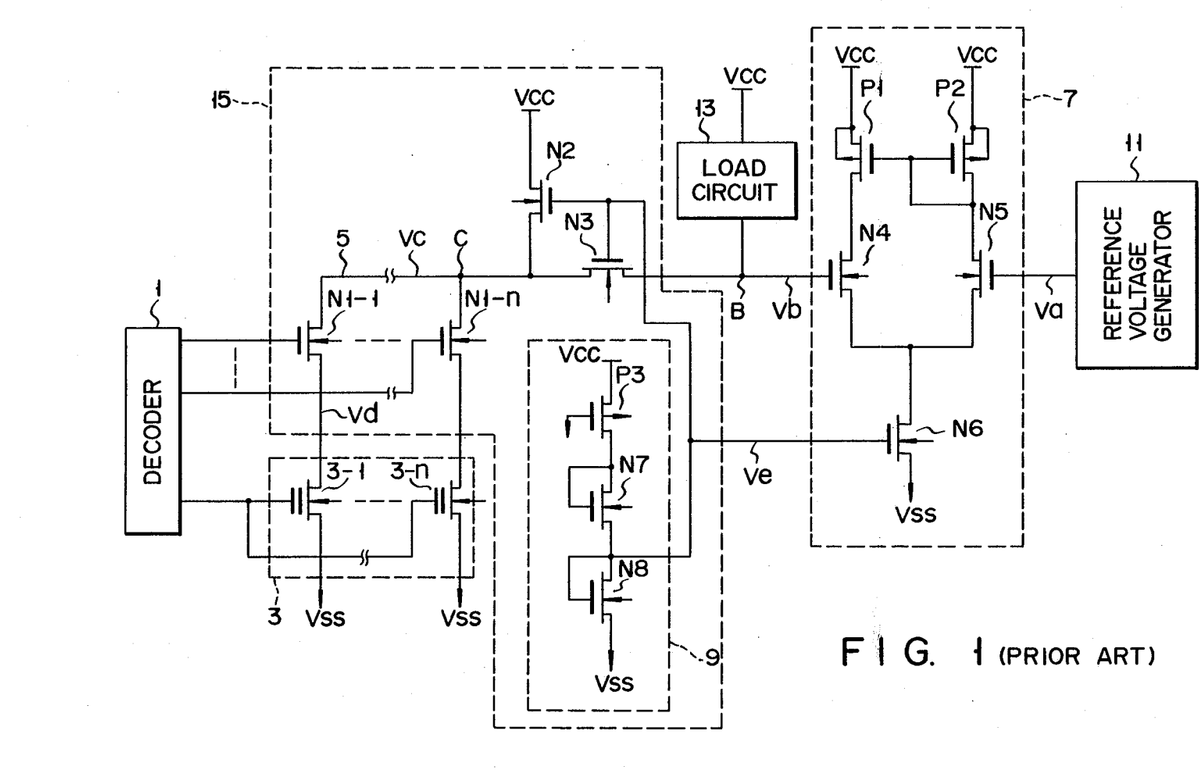
FIG. 1 is a circuit diagram showing an example of a conventional floating gate memory device.

FIG. 1 shows a modified and simplified circuit of a floating gate memory device shown in FIG. 1 of U.S. Pat. No. 4,223,394. In this circuit, a detector 15 detects storage data in a floating gate memory 3 (n floating gate memories 3-1 to 3-n) selected by a decoder 1 and produces a detection signal corresponding to the detected storage data. A sensing amplifier 7 compares a reference voltage from a reference voltage generator 11 with the detection signal, and produces a binary signal corresponding to the storage data of the floating gate memory 3 selected by the decoder 1. A load circuit 13 amplifies the detection signal to be supplied to the sensing amplifier 7.

In the semiconductor memory device having the configuration shown in FIG. 1, voltages Vcc, Ve and Vss satisfy the relation Vcc>Ve>Vss. The voltage Vcc is set, for example, to be 5 V; Ve is set to be 3 V; and Vss is set to be the ground potential. An address signal is supplied to the decoder 1 from a computer (not shown) or the like through the address buffer circuit (not shown). For the sake of simplicity, it is assumed that the address signal designates the floating gate memory 3-1. The decoder 1 decodes this address signal. The n floating gate memories 3-1 to 3-n are connected to a line 5 through n-channel MOS transistors N1-1 to N1-n, respectively. In order to select the memory 3-1, the decoder 1 supplies a signal of H level to the gates of the n-channel MOS transistor N1-1 and the memories 3-1 to 3-n. If a signal is not written in the memory 3-1, the memory 3-1 is turned on. Since the voltage Vss is applied to the source of the memory 3-1, as shown in FIG. 1, the voltage Vd at a node between the memory 3-1 and the n-channel MOS transistor N1-1 drops. Then, the n-channel MOS transistor N1-1 is also turned on, and the voltage Vc at a node C of the line 5 and the n-channel MOS transistors N1-1 to N1-n also drops.

Meanwhile, the source of an n-channel MOS transistor N2 is connected to the line 5, and the drain thereof receives the voltage Vcc. An n-channel MOS transistor N3 (transfer gate) is inserted in series between the line 5 and the sensing amplifier 7 comprising a current mirror type differential amplifier. The sensing amplifier 7 comprises p-channel MOS transistors P1 and P2, and n-channel MOS transistors N4, N5 and N6. A bias circuit 9 consists of a p-channel MOS transistor P3 and n-channel MOS transistors N7, N8. The bias circuit 9 applies constant voltage Ve to the gates of the n-channel MOS transistors N2, N3 and N6. The n-channel MOS transistors N2 and N3 are turned on by a decrease in the voltage Vc. Then, the voltage Vb at a node B of the n-channel MOS transistor N3 and the sensing amplifier 7 also drops. The load circuit 13 connected to the node B thereto supplies a current which is determined by the ratio of the conductances of the n-channel MOS transistors N2 and N3. The voltage Vb becomes lower than a reference voltage Va which is the output voltage from the reference voltage generator 11. The sensing amplifier 7 compares the voltages Vb and Va and produces a binary signal corresponding to the comparison result (Va>Vb). In other words, the sensing amplifier 7 produces a binary signal which represents that the memory 3-1 is in the non-written state. However, if a signal has been written in the memory 3-1, the memory 3-1 is OFF, even if a signal of H level is supplied to the gate thereof. The node C is charged by the n-channel MOS transistors N2 and N3; and the voltage Vc at this node C increases. However, in this case, the voltage Vc is limited to a voltage Vcc-Vthn-Vthb (Vthn is the threshold voltage of the n-channel MOS transistor when the bias of substrate is zero and Vthb is the increment of the threshold voltage due to the substrate bias effect of the n-channel MOS transistor). Therefore, the voltage Vthb is also limited to a value lower than the upper limit of the voltage Vc. A high voltage is not therefore applied to the memory 3-1 so that the memory content therein is not accidentally changed.

When the voltage Vc at the node C reaches the upper limit, the n-channel MOS transistors N2 and N3 are turned off. The node B is therefore charged, and the voltage Vb is increased to be higher than the reference voltage Va. The sensing amplifier 7 compares the voltages Vb and Va, detects that data is written in the memory 3-1, and produces a corresponding binary signal. In this manner, the load circuit 13 performs amplification on the voltage Vb at the node B.

Figure 2:
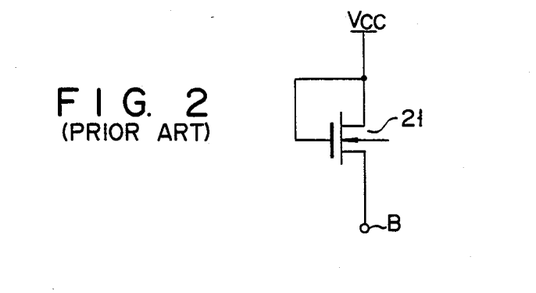
FIG. 2 is a circuit diagram showing a conventional load circuit.
Figure 4:
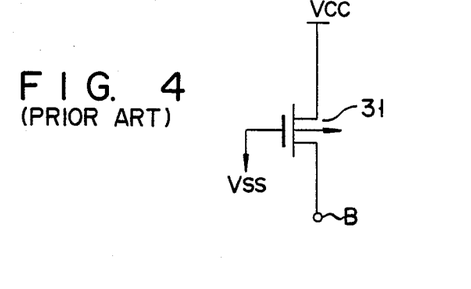
FIG. 4 is a circuit diagram showing another conventional load circuit.

The load circuit 13 of the conventional semiconductor memory device generally comprises an n-channel enhancement type (n-channel E-type) MOS transistor 21 having a gate and drain receiving the voltage Vcc and the source connected to the node B, as shown in FIG. 2. Alternatively, the load circuit 13 conventionally comprises a p-channel enhancement type (p-channel E-type) MOS transistor 31 having a source receiving the voltage Vcc, a gate receiving the voltage Vss, and a drain connected to the node B, as shown in FIG. 4.

The sensing amplifier 7 in the memory device of U.S. Pat. No. 4,223,394 comprises n-channel MOS transistors, which have disadvantages such as low operating speed and low sensitivity. Sensing amplifier 7 may alternatively comprise CMOS transistors. The inventors measured the characteristics of such a memory device with a sensing amplifier of CMOS transistors and a conventional load circuit.

Figure 3:
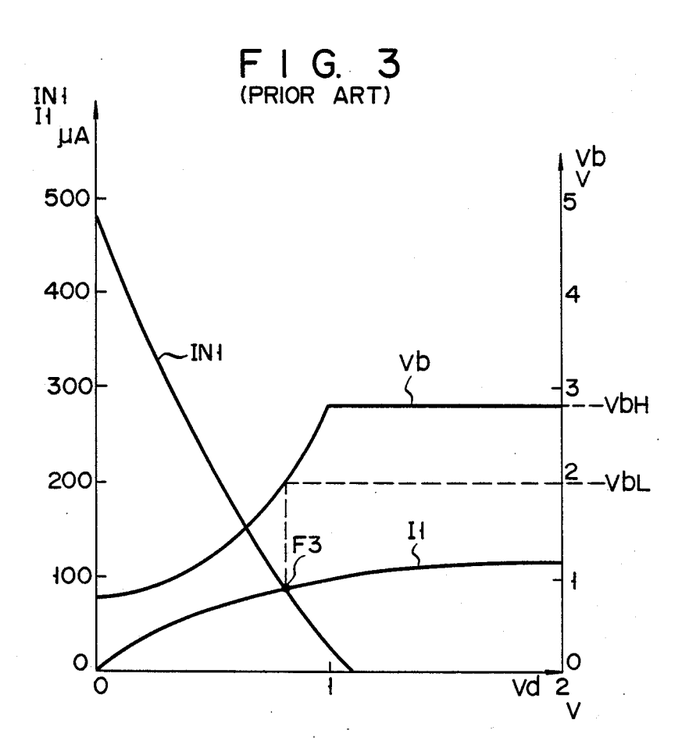
FIG. 3 is a graph showing the voltage/current characteristics at each part of the circuit obtained when the load circuit shown in FIG. 2 is used in the floating gate memory device shown in FIG. 1 with a CMOS sense amplifier.

FIG. 3 shows an example of the relationship between the voltage Vd, the voltage Vb, a current IN1 flowing in the n-channel MOS transistor N1-1, and a current I1 flowing in the memory 3-1 in the unwritten state, when the MOS transistor 21 is used as the load circuit 13 and the sensing amplifier comprises CMOS transistors. A voltage VbL corresponding to point F3 where the currents IN1 and I1 coincide appears at the node B when a signal is not written in the memory 3-1. When a signal is written in the memory 3-1, the voltage Vb at the node B is increased to only Vcc-Vthn-Vthb (VbH) (Vthn is the threshold voltage of the n-channel MOS transistor when the bias of substrate is zero and Vthb is the increment of the threshold voltage due to the substrate bias effect of the n-channel MOS transistor). In general, the voltage drop due to the substrate bias effect of the n-channel MOS transistor is great. Therefore, the level width of the voltage Vb at the node B (the difference between the voltages VbL and VbH) is small, for example, in FIG. 3, VbL is 2 V, and VbH is 2.8 V. The sensing amplifier 7 must therefore be able to sense a small voltage difference between the reference voltage Va and the voltage Vb. The sensing amplifier 7 must therefore have high sensitivity and high precision. It is therefore difficult to design and manufacture the sensing amplifier 7. Moreover, the sensing amplifier 7 is susceptible to the adverse effect of noise. The operation speed of the sensing amplifier 7 and hence that of the semiconductor memory device shown in FIG. 1 will be lower.

Figure 5:
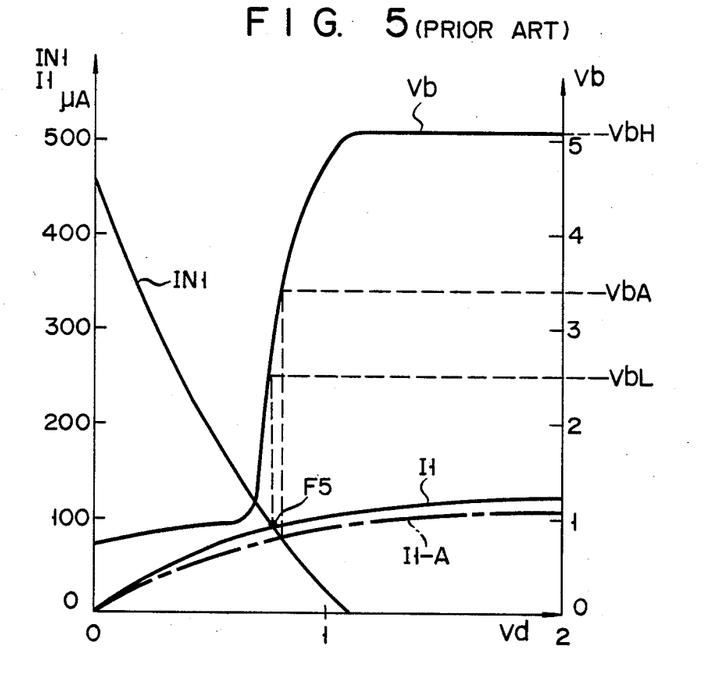
FIG. 5 is a graph showing the voltage/current characteristics at each part of the circuit obtained when the load circuit shown in FIG. 4 is used in the floating gate memory device shown in FIG. 1 with a CMOS sense amplifier.

FIG. 5 shows the relationship between the voltage Vd, the voltage Vb, the current IN1 flowing in the n-channel MOS transistor N1-1, and the current I1 flowing to the memory 3-1 in which no signal is written, when the p-channel MOS transistor 31 is used as the load circuit 13 and the sensing amplifier comprises CMOS transistors. The p-channel MOS transistor 31 operates in a triode region. As shown in FIG. 5, the voltage Vb changes significantly in accordance with changes in the process parameters and also with changes in the current I1. When the current I1 changes to I1-A, the voltage Vb supplied to the sensing amplifier 7 largely deviates from the voltage VbL and becomes VbA, due to manufacturing variations in the memory 3-1. This renders the selection and setting of the reference voltage Va difficult. Depending upon the value of the reference voltage Va, the level VbL of the voltage Vb cannot be detected, and a correct output signal cannot be obtained. The operating speed of the sensing amplifier may also vary. The precision of each element constituting the semiconductor memory device must be increased.

EPROMs, RAMs and the like have become more highly integrated recently. With such a trend, the actual amount of the signal carriers to be stored in a memory cell of the PROM or RAM is decreased. For this reason, a semiconductor memory device capable of detecting a signal of small magnitude written in the memory cell and of producing a corresponding binary signal with high precision is required.

A EPROM with a sensing amplifier consisting of a differential amplifier comprising CMOS transistors has not yet been proposed. It is therefore generally necessary to select a semiconductor memory device having an optimal circuit configuration from those having sense amplifiers consisting of CMOS transistors.

SUMMARY OF THE INVENTION

The present invention has been made in consideration of this and has as its object to provide a semiconductor memory device which can produce a correct output signal, can operate at high speed, and is easy to manufacture.

A semiconductor memory device according to the present invention comprises: memory cells; selecting means connected to the memory cells for selecting a memory cell which corresponds to the address signal; detecting means connected to said memory cells for detecting data stored in the memory cell selected by the selecting means and for producing a detection signal corresponding to the detected data; binary signal generating means connected to said detecting means for producing a binary signal corresponding to the data stored in said memory cell selected by said selecting means based on the detection signal; and loading means comprising at least one p-channel E-type MOS transistor having a gate and drain connected to a node of the detecting means and the binary signal generating means, and having a source and substrate for receiving a predetermined potential, said loading means amplifying the detection signal produced by said detection means.

In the semiconductor memory device having the configuration described above, loading means comprising the p-channel E-type MOS transistor having the gate and drain connected to the detecting means and having the source and the substrate for receiving the first voltage amplifies the detection signal the p-channel transistor is not influenced by the substrate bias effect, so that the H level of the detection signal is improved. Therefore, the voltage difference (level width) between the high (H) level and low (L) level of the detection signal supplied to the amplifying means becomes greater than that obtained when the load circuit comprises a conventional n-channel MOS transistor. The amplifying means can therefore compare the reference voltage with a detection signal having a great voltage difference therefrom. The amplifying means can therefore operate at high speed, and hence the semiconductor memory device can also operate at high speed. The noise margin is also increased.

On the other hand, the detection signal amplified by the loading means only changes moderately with a change in the process parameters, and is especially insensitive to a current flowing in the memory cell as compared to the case wherein the load circuit comprises a conventional p-channel MOS transistor because the p-channel transistor of the invention operates in pentode (saturation region). Therefore, even if the process parameters deviate from the prescribed values, the change in the detection signal is not significant. In the semiconductor memory device of the present invention, it is easy to select and set the reference voltage. The restrictions on design and manufacture of the respective parts of the semiconductor memory device are also eased. Thus, the present invention provides a semiconductor memory device which can quickly and correctly detect data stored in the memories and which can produce binary signals corresponding to the stored data.

DETAILED DESCRIPTION OF THE PREFERRED EMBODIMENTS

The preferred embodiment of the present invention will be described with reference to FIGS. 6 and 7. The same reference numerals throughout FIGS. 6 and 7 denote the same parts shown in FIGS. 1 to 5, and a detailed description thereof will thus be omitted. The characteristic feature of the semiconductor memory device shown in FIG. 6 resides in the fact that a load circuit 13 comprises a p-channel E-type MOS transistor 41. Voltage Vcc is applied to a source and a substrate of the p-channel E-type MOS transistor 41, the gate and drain of which are connected to a node B (between a sensing amplifier 7 and an n-channel MOS transistor N3). Sensing amplifier 7 comprises a current mirror type differential amplifier with CMOS construction. The reference voltage generator 11 has the following construction. An n-channel MOS transistor 45 is connected to a floating gate memory 43. An n-channel MOS transistor 47 is connected in series between the n-channel MOS transistor 45 and the sensing amplifier 7. The source of an n-channel MOS transistor 49 is connected to the node between the n-channel MOS transistors 45 and 47. The voltage Vcc is applied to the gates of the floating gate memory 43 and the n-channel MOS transistor 45. A voltage Ve is applied to the gates of the n-channel MOS transistors 47 and 49 by a bias circuit 51 having the same configuration as that of the bias circuit 9 of FIG. 1. A p-channel MOS transistor 53 as a load circuit is connected to a node A of the n-channel MOS transistor 47 and the sensing amplifier 7. The p-channel MOS transistor 53 has the same configuration as that of the p-channel MOS transistor 41. More specifically, voltage Vcc is applied to the source and the substrate of the p-channel E-type MOS transistor 53, the gate and drain of which are connected to the node A. It is important that no signal be written in the floating gate memory 43. Since the voltage Vcc is applied to the gate of the memory 43, the memory 43 is ON. Furthermore, the p-channel MOS transistor 53 must have a conductance larger than that of the p-channel MOS transistor 41. Since the reference voltage generator 11 has the configuration described above, the reference voltage Va generated thereby is set to be an intermediate value between the levels VbH and VbL of the voltage Vb.

The read operation from the memory of the semiconductor memory device of the configuration described above can be performed in a similar manner to that described with reference to FIG. 1. A p-channel MOS transistor is not subject to a voltage drop due to the substrate bias effect. Therefore, the H-level VbH of the voltage Vb at the node B is increased to level Vcc - Vthp (where Vthp is the threshold value of the p-channel MOS transistor). On the other hand, the low level VbL of the voltage Vb remains substantially the same as that obtained in the case wherein the n-channel MOS transistor 21 is used as the load circuit. Therefore, the difference (level width) between the high and low levels of the voltage Vb at the node b becomes larger than that obtained in the case wherein the n-channel MOS transistor 21 is used as a load circuit, by the voltage drop due to the n-channel MOS transistor 21. In the case shown in FIG. 7, the voltage VbH is 4.2 V, and the voltage VbL is 2.5 V. The p-channel MOS transistor 41 operates in a pentode region. Therefore, the conductance of the transistor 41 is proportional to $(Vcc-Vthp-Vb)^2$ (where Vthp is the threshold voltage of the p-channel MOS transistor). The changes in the voltage Vb at the node B with changes in the voltage Vd become smaller than those shown in FIG. 5. Therefore, even if the process parameters, especially, the current I1 flowing in the memory 3-1 deviate from the prescribed values, the voltage Vb does not significantly change. It is thus easy to select and set the reference voltage. The manufacturing margins of the respective elements of the semiconductor memory device can also be increased.

Figure 6:
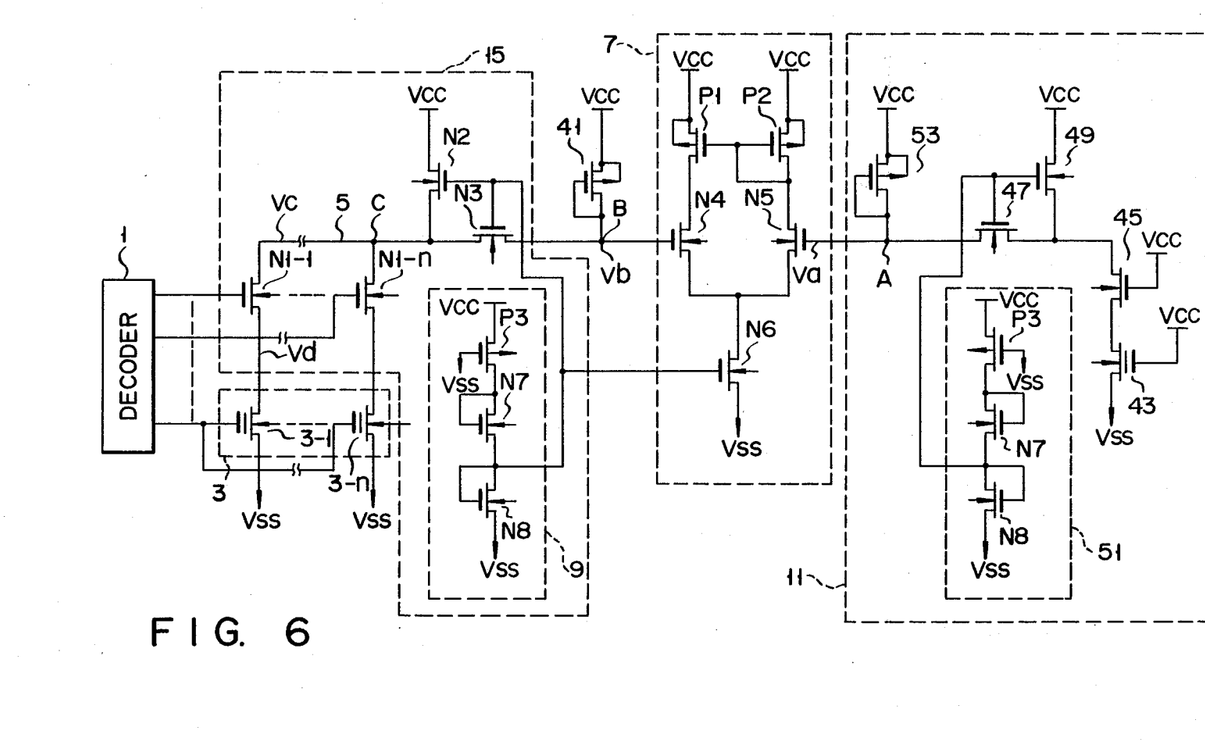
FIG. 6 is a circuit diagram showing the configuration of a floating gate memory according to the present invention.
Figure 7:
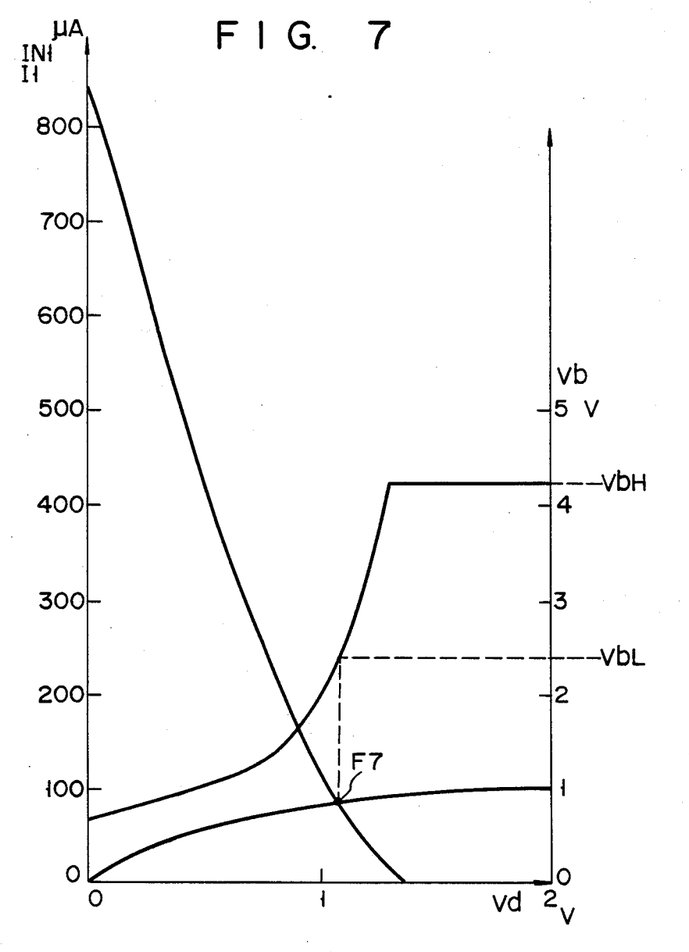
FIG. 7 is a graph showing the voltage/current characteristics at each part of the floating gate memory shown in FIG. 6.

A simulation of the voltage Vd, a current IN1 flowing to an n-channel MOS transistor N1-1, a current I1 flowing to a memory 3-1, and the voltage Vb in the semiconductor memory device of the configuration shown in FIG. 6 was performed. FIG. 7 shows the simulation results obtained. Note that the value VbL of the voltage Vb corresponding to an intersection F7 of the curves of the currents IN1 and I1 is at the low level of the voltage Vb. As may be apparent from FIG. 7, the difference between the high level VbH and the low level VbL of the voltage Vb is larger than that obtained when the n-channel MOS transistor 21 is used. The voltage difference between the voltages Vb and Va can be increased, and the operating speed of the sensing amplifier 7 can thus be improved. The noise margin is also improved. Even if the current I1 changes, the change in voltage Vb is not significant. The allowances in designing and manufacturing the semiconductor memory device can be relaxed.

Figure 8:
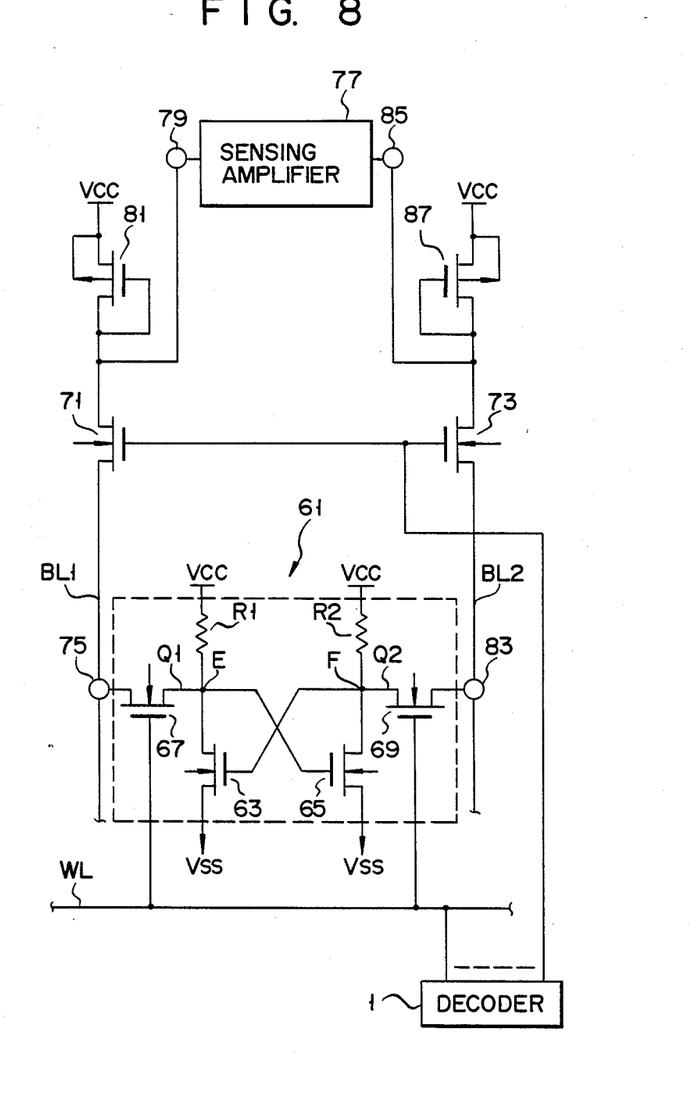
FIG. 8 is a circuit diagram of another embodiment of the present invention.

In the embodiment described above, the load circuit according to the present invention is used in a floating gate memory device. However, the present invention is not limited to this. For example, the present invention can be applied to a static RAM device as shown in FIG. 8. Another embodiment of the present invention will therefore be described below with reference to FIG. 8. Referring to FIG. 8, a static RAM 61 comprises n-channel MOS transistors 67 and 69 and a flip-flop consisting of n-channel MOS transistors 63 and 65, and resistors R1 and R2. A plurality of RAM cells having such a configuration are connected between bit lines BL1 and BL2. A signal Q1 appears at a node E in a readout state. A signal Q2 appears at a node F in a readout state. The signals Q1 and Q2 have different logic levels from each other. When the RAM 61 is selected by a decoder 1, a voltage of H level is applied to a word line WL and the gates of n-channel MOS transistors 71 and 73. As a result, the n-channel MOS transistors (transfer gates) 67, 69, 71, and 73 are turned on. The signal Q1 is supplied to one input terminal 79 of a sensing amplifier 77 through the n-channel MOS transistor 67, one input/output terminal 75, the bit line BL1, and the n-channel MOS transistor 71. The sensing amplifier 77 can have the same configuration as that of the sensing amplifier 7 shown in FIG. 6. A p-channel MOS transistor 81 amplifies a signal supplied to the one input terminal 79 of the sensing amplifier 77 as a load circuit. Meanwhile, the signal Q2 is supplied to the other input terminal 85 of the sensing amplifier 77 through the n-channel MOS transistor 69, the other input/output terminal 83, the bit line BL2, and the n-channel MOS transistor 73. A p-channel MOS transistor 87 amplifies a signal supplied to the other input terminal 85 of the sensing amplifier 77. The sensing amplifier 77 compares the two input voltages applied to the two input terminals 79 and 85 and produces a binary signal corresponding to the memory data of the RAM 61.

In the embodiments described above, the reference voltage generator is not limited to the one having the configuration indicated by a broken line 11 in FIG. 6. For example, a constant voltage generator similar to the bias circuit 9 shown in FIG. 1 can also be used. In fact, any circuit capable of stably generating a predetermined voltage can be used.

The sensing amplifier described with reference to the above embodiments is not limited to a current mirror differential amplifier as shown in FIG. 6. Any sensing amplifier capable of comparing a voltage of the detection signal and the reference voltage, and of immediately producing a corresponding binary signal can be used.

What is claimed is:

1. A semiconductor memory device responsive to an address signal comprising:

at least one floating gate memory cell;

selecting means, connected to said at least one memory cell, for receiving said address signal and selecting a memory cell which corresponds to said address signal;

detecting means, connected to said at least one memory cell, for detecting data stored in said memory cell selected by said selecting means and for producing a detection signal corresponding to said detected data;

binary signal generating means, connected to said detecting means and comprising CMOS transistors, for receiving said detection signal and, based on said detection signal, producing a binary signal corresponding to said data stored in said memory cell selected by said selecting means; and loading means, comprising at least one p-channel enhancement-type MOS transistor having a gate and drain connected to a node of said detecting means and said binary signal generating means, and also having a source and substrate for receiving a predetermined voltage, for amplifying the detection signal produced by said detection means.

2. A semiconductor memory device according to claim 1, wherein said detecting means comprises:

at least one first transistor having one end of a current path thereof connected to said at least one memory cell, a line, connected to the other end of the current path of said at least one first transistor, for transmitting a signal, a second transistor having one end of a current path thereof connected to said line, the other end of said current path receiving the predetermined voltage, a third transistor connected in series between said line and said binary signal generating means, and biasing means, connected to the gates of said second transistor and said third transistor, for applying another predetermined voltage thereof; and wherein said loading means p-channel enhancement-type MOS transistor has its gate and drain connected to a node between said third transistor and said binary signal generating means.

3. A semiconductor memory device according to claim 1, wherein said binary signal generating means comprises:

a binary signal generator memory cell;

binary signal generator detecting means, connected to said binary signal generator memory cell, for detecting data stored in said binary signal generator memory cell and for producing a binary signal generator means detection signal corresponding to said detected data;

amplifying means, connected to said detecting means and said binary signal generator detecting means, for producing a binary signal corresponding to said data stored in said memory cell selected by said selecting means; and a binary signal generator p-channel enhancement-type MOS transistor having a gate and a drain connected to a node between said binary signal generator detecting means and said amplifying means, a source and a substrate for receiving the predetermined voltage, said binary signal generator p-channel enhancement-type MOS transistor amplifying the binary signal generator detection signal.

4. A semiconductor memory device according to claim 3, wherein said binary signal generator detecting means has substantially the same configuration as that of said detecting means.

* * * * *